United States Patent
Nguyen

(12) 
(10) Patent No.: US 6,650,196 B2
(45) Date of Patent: Nov. 18, 2003

(54) MULTI-FREQUENCY BAND CONTROLLED OSCILLATOR

(75) Inventor: Andrew D. Nguyen, Temple City, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 09/967,308

(22) Filed: Sep. 28, 2001

(65) Prior Publication Data

US 2002/0075088 A1 Jun. 20, 2002

Related U.S. Application Data

(60) Provisional application No. 60/236,686, filed on Sep. 29, 2000.

(51) Int. Cl.[7] .............................................. H03B 27/00
(52) U.S. Cl. ........................... 331/179; 331/183; 331/57
(58) Field of Search ..................... 331/34, 57, 107 R, 331/8, 177 R, 10, 183, 179, 175

(56) References Cited

U.S. PATENT DOCUMENTS

| | | | |
|---|---|---|---|
| 4,057,760 A | 11/1977 | Koch | 325/455 |
| 4,893,087 A | 1/1990 | Davis | 328/14 |
| 5,053,723 A | 10/1991 | Schemmel | 331/14 |
| 5,175,884 A | 12/1992 | Suarez | 455/260 |
| 5,382,921 A * | 1/1995 | Estrada et al. | 331/1 A |
| 5,477,198 A | 12/1995 | Anderson et al. | |
| 5,559,473 A | 9/1996 | Anderson et al. | |
| 5,648,744 A | 7/1997 | Prakash et al. | 331/11 |
| 5,952,892 A * | 9/1999 | Szajda | 327/157 |
| 6,072,372 A | 6/2000 | Yokoyama | 331/57 |
| 6,091,304 A * | 7/2000 | Harrer | 331/10 |
| 6,112,068 A | 8/2000 | Smith et al. | 455/260 |
| 6,114,920 A | 9/2000 | Moon et al. | 331/179 |

FOREIGN PATENT DOCUMENTS

| | | | |
|---|---|---|---|
| DE | 29809632 U | 11/1998 | ............ H03L/7/06 |
| EP | 0430493 | 6/1991 | |
| EP | 0442461 | 8/1991 | |
| EP | 0563400 A1 | 10/1992 | ............ H03L/7/18 |
| EP | 0661816 B1 | 12/1994 | ......... H03L/7/1875 |
| EP | 0664616 A3 | 1/1995 | ............ H03L/7/10 |
| EP | 0689287 | 12/1995 | |
| EP | 0874463 A2 | 4/1998 | ............ H03L/7/18 |
| EP | 0910170 A2 | 10/1998 | ........... H03L/7/099 |
| EP | 0944171 A1 | 3/1999 | ............ H03L/7/10 |
| JP | 57076931 | 5/1982 | |
| WO | WO8906456 | 12/1988 | ........... H03B/19/00 |

OTHER PUBLICATIONS

Mihai Banu, *MOS Oscillators With Multi–Decade Tuning Range And Gigahertz Maximum Speed*, IEE Journal of Solid–State Circuits, vol. 23, No. 6, Dec. 1988, pp. 1386–1393.

Mihai Banu, *Design Of High–Speed, Wide–Band MOS Oscillators For Monolithic Phase–Locked Loop Applications*, IEE ISCAS '88, pp. 1673–1677.

Mihai Banu, *High–Speed Data Recovery*, ISSCC '88, Digest of Technical Papers, 3 pages.

* cited by examiner

*Primary Examiner*—Robert Pascal
*Assistant Examiner*—Kimberly E Glenn
(74) *Attorney, Agent, or Firm*—McAndrews, Held & Malloy, Ltd.

(57) ABSTRACT

A variable frequency output signal is generated in response to a control signal by providing an oscillator (50) that generates the output signal in different frequency ranges depending on the value of an operating parameter, such as DC bias current. A first circuit (60) adjusts the operating parameter values and a second circuit (80) controls the Kvco of the oscillator.

7 Claims, 3 Drawing Sheets

MULTI-FREQUENCY BAND CONTROLLED OSCILLATOR

CROSS REFERENCE TO RELATED APPLICATION

The applicant claims priority based on provisional application No. 60/236,686, filed Sep. 29, 2000.

BACKGROUND OF THE INVENTION

This invention relates to controlled oscillators and more particularly relates to such oscillators in which oscillator gain is controlled.

In communication systems today, a wide range of frequencies is employed in controlled oscillators, such as voltage controlled oscillators (VCOs). Typically, such VCOs are employed in phase locked loops. The VCOs generate frequencies over a wide range in response to a control voltage, Vc. The ratio of a change in the oscillator frequency to a change in Vc is known as the VCO gain or Kvco.

The range of Vc is limited by the supply voltage, which typically is small in the integrated circuits used in communication systems. In known systems, Vc is substantially smaller than the supply voltage. In the known systems, if a large frequency range must be generated in response to a small Vc range, then Kvco must have a relatively large value. However, a large Kvco value results in the other problems. For example, as the Kvco value increases, oscillator instability and phase noise also increase. In known systems, Kvco also tends to be non-linear. This problem increases the complexity of the circuitry required to accurately control the output frequency.

The inventor has discovered a technique for solving these problems and for keeping Kvco at a relatively small and relatively constant value, thereby increasing the accuracy of the output frequency and reducing the complexity of related circuitry.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

One apparatus embodiment of the invention is useful to generate a variable frequency output signal in response to a control signal. For such an application, the embodiment comprises an oscillator arranged to generate the output signal with a frequency adjustable within a first frequency range in response to a first parameter value of an operating parameter and adjustable within a second frequency range in response to a second parameter value of the operating parameter. The frequency is generated within the first frequency range and the second frequency range in response to a control value of the control signal. The control value is within a predetermined control value range. A first circuit is arranged to adjust the parameter values of the operating parameter. A second circuit is arranged to control a ratio of the frequency to the control value within at least the first frequency range.

One method embodiment of the invention is useful for generating a variable frequency output signal in response to a control signal. For such an application, the embodiment comprises generating the output signal with a frequency adjustable within a first frequency range in response to a first parameter value of an operating parameter and adjustable within a second frequency range in response to a second parameter value of the operating parameter. The frequency is generated within the first frequency range and the second frequency range in response to a control value of the control signal. The control value being within a predetermined control value range. The parameter values of the operating parameter are adjusted. A ratio of the frequency to the control value is controlled within at least the first frequency range.

By using the foregoing techniques, controlled oscillators can be made with a degree of accuracy previously attainable only by much more complex and costly devices.

These and other advantages and novel features of the present invention, as well as details of an illustrated embodiment thereof, will be more fully understood from the following description and drawings.

DETAILED DESCRIPTION OF THE INVENTION

Figure 1:
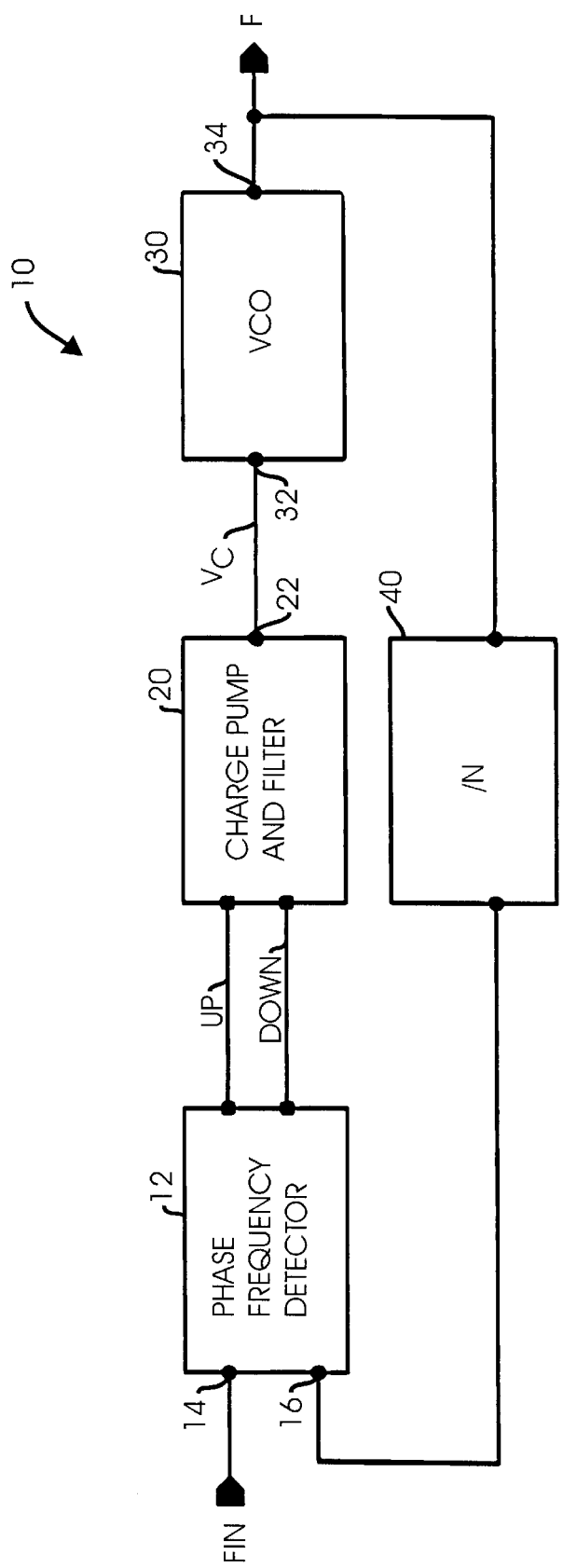
FIG. 1 is a schematic block diagram of one form of a phase locked loop using one form of a voltage controlled oscillator (VCO) embodying the invention.

Referring to FIG. 1, one embodiment of the invention may be used in a phase locked loop 10 including a phase frequency detector 12 having input terminals 14 and 16. Detector 12 behaves as an error amplifier, which provides output signals UP and DOWN to a charge pump and filter 20. The UP and DOWN signals depend on the frequency and phase of both input signals on terminals 14 and 16.

Charge pump and filter 20 contain switches, which take the signals from detector 12. Device 20 also includes current sources. The purpose of device 20 is to convert discrete time domain functions from detector 12 to a control signal generated on a terminal 22. The control signal may be a voltage signal or a current signal depending on the type of controlled oscillator 30 employed in the phase locked loop 10. In the embodiment shown in FIG. 1, controlled oscillator 30 is a voltage controlled oscillator (VCO) and the control signal is a control voltage, Vc, that is received by an input terminal 32 of VCO 30.

The VCO output signal is divided by a divider circuit 40. In the embodiment shown in FIG. 1, circuit 40 divides by a value N, which, for purposes of clarity, will be assumed to be 1. However, any value of N could be employed. Circuit 40 generates the input signal received by input terminal 16.

Figure 2:
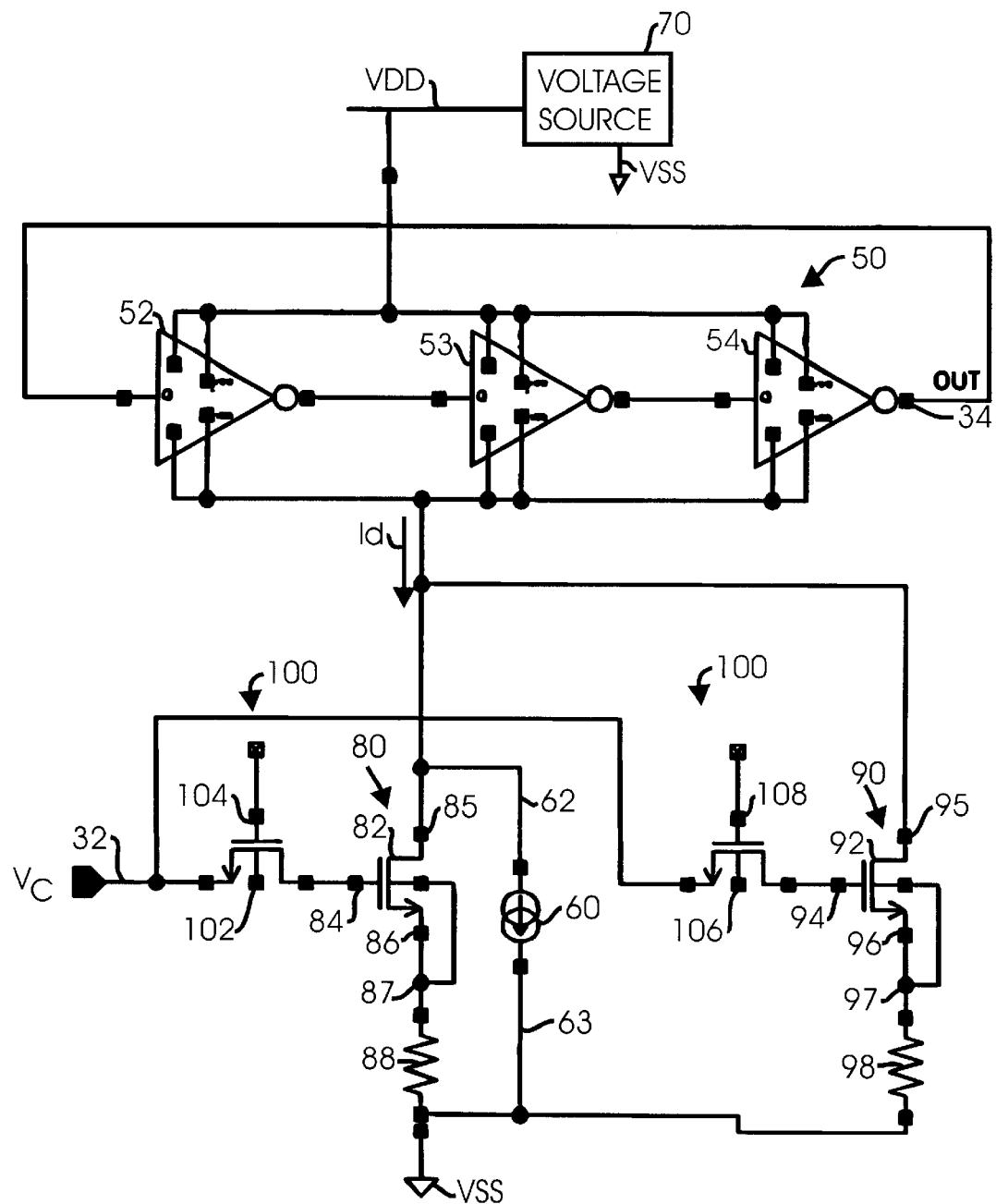
FIG. 2 is a schematic diagram of the VCO shown in FIG. 1 employing a current source.

Referring to FIG. 2, VCO 30 comprises a ring oscillator 50 including inverters 52–54 connected as shown. Oscillator 50 generates an output signal at a terminal 34 with a frequency adjustable within a first frequency range in response to a first parameter value of an operating parameter, such as a DC bias current Id, and adjustable within a second frequency range in response to a second parameter value of Id. The frequency of the output signal on terminal 34 is generated within the first frequency range and the second frequency range in response to a control value of the control signal, Vc. The control value is within a predetermined control value range.

Figure 3:
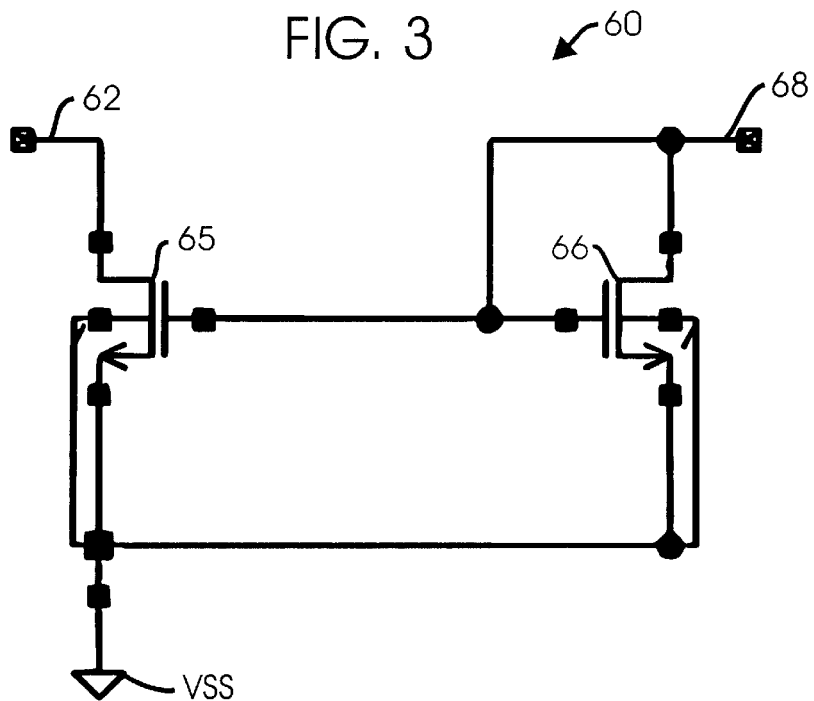
FIG. 3 is a schematic diagram of the current source shown in FIG. 2.

An adjustable current source 60 connected through conductors 62 and 63 adjusts the values of Id. Referring to FIG. 3, current source 60 includes NMOS field effect transistors (FETs) 65 and 66 connected as shown. FET 66 provides a bias voltage to FET 65. The bias voltage can be generated from a bandgap voltage. The bias current provided by source 60 is adjusted by a control circuit not shown. Those skilled in the art of VCOs understand how to design such a control circuit.

Referring again to FIG. 2, a voltage source 70 defines a supply voltage range between voltages Vdd and Vss.

A circuit 80 controls the Kvco of oscillator 50 within a first range of frequencies. Circuit 80 includes an NMOS FET 82 having a gate 84, a source 85 and a drain 86. The source and drain define a source-drain path 87. A one K ohm resistor 88 is connected as shown in series with the source-drain path 87.

A circuit 90 controls the Kvco of oscillator 50 within a second range of frequencies. Circuit 90 includes an NMOS FET 92 having a gate 94, a source 95 and a drain 96. The source and drain define a source-drain path 97. A one K ohm resistor 98 is connected as shown in series with the source-drain path 97.

A switch circuit 100 includes an NMOS FET 102 with a gate 104 and an NMOS FET 106 with a gate 108.

Figure 4:
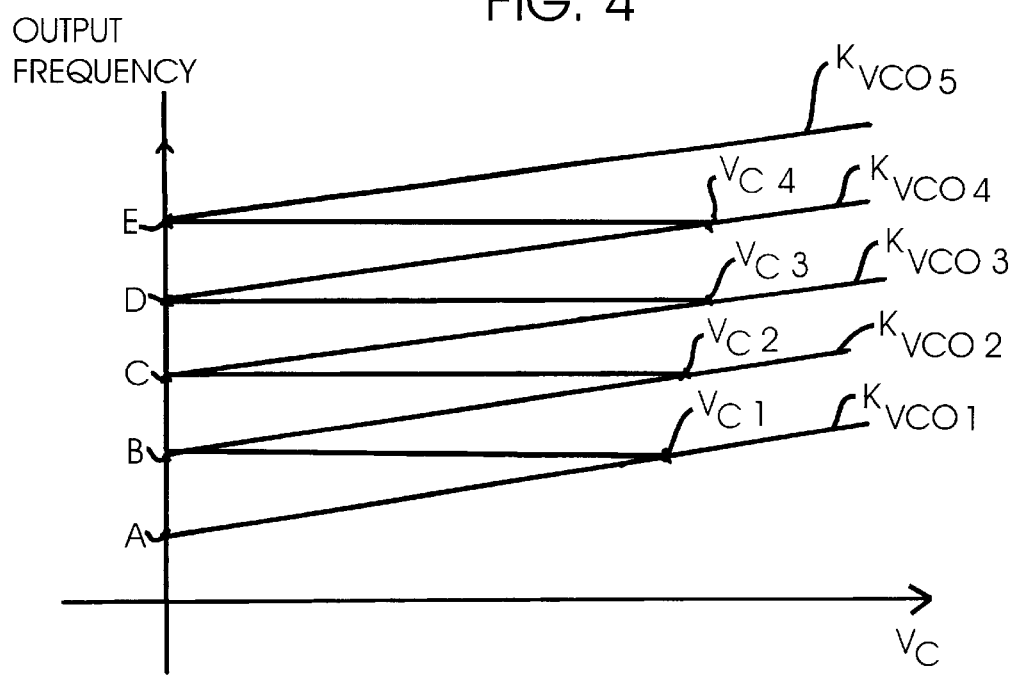
FIG. 4 is a graph illustrating output frequency versus control voltage for the VCO shown in FIG. 1.

Referring to FIG. 4, when operation between frequency A and frequency C is desired, FET 102 is switched on and FET 106 is switched off (FIG. 2), thereby switching circuit 80 into operation and switching circuit 90 out of operation. For operation between frequencies A and B, source 60 is switched out of the circuit and circuit 80 then defines a gain of oscillator 50 shown as Kvco1. The frequencies in range A–B are generated in response to Vc within the range of 0 to Vc1.

For operation between frequencies B and C, source 60 is switched into the circuit and is controlled to adjust bias current Id to a value that causes oscillator 50 to have a gain of Kvco2. The frequencies in range B–C are generated in response to Vc within the range of 0 to Vc2.

When operation between frequency C and frequency E is desired (FIG. 4), FET 102 is switched off and FET 106 is switched on, thereby switching circuit 80 out of operation and switching circuit 90 into operation. For operation between frequencies C and D, source 60 and circuit 90 together define a gain of oscillator 50 shown as Kvco3. The frequencies in range C–D are generated in response to Vc within the range of 0 to Vc3.

For operation between frequencies D and E, source 60 is controlled to adjust bias current Id to a value that causes oscillator 50 to have a gain of Kvco4. The frequencies in range D–E are generated in response to Vc within the range of 0 to Vc4.

For operation between frequencies E and a frequency higher than E, source 60 is controlled to adjust bias current Id to a value that causes oscillator 50 to have a gain of Kvco5. The frequencies in range above E are generated in response to Vc within the range of 0 to Vc5.

As shown in FIG. 4, the values of Vc1–Vc5 are substantially the same. The slopes of the lines Kvco1–Kvco5 are substantially linear and constant and have a relatively small value.

A separate circuit like 80 and 90 can be provided for each frequency range of interest (e.g., range A–B) if desired. Of course, additional switches must be added to switch circuit 100 for such applications.

By using the foregoing techniques, control voltage ranges defined by Vc1–Vc5 can be made to within at least 90 percent of the supply voltage range Vdd–Vss.

While the invention has been described with reference to one or more preferred embodiments, those skilled in the art will understand that changes may be made and equivalents may be substituted without departing from the scope of the invention. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. Apparatus arranged to generate a variable frequency output signal in response to a control signal comprising:

an oscillator arranged to generate the output signal with a frequency adjustable within a first frequency range in response to a first parameter value of an operating parameter and adjustable within a second frequency range in response to a second parameter value of the operating parameter, the frequency being generated within the first frequency range and the second frequency range in response to a control value of the control signal, the control value being within a predetermined control value range;

a first circuit arranged to adjust the parameter values of the operating parameter; and a second circuit arranged to control a ratio of the frequency to the control value within at least the first frequency range, said second circuit comprising a transistor defining an output path and a resistor connected in the output path.

2. The apparatus of claim 1 wherein the transistor comprises a field effect transistor including a source and drain defining a source-drain path.

3. The apparatus of claim 2 wherein the output path comprises the source-drain path.

4. Apparatus arranged to generate a variable frequency output signal in response to a control signal comprising:

an oscillator arranged to generate the output signal with a frequency adjustable within a first frequency range in response to a first parameter value of an operating parameter and adjustable within a second frequency range in response to a second parameter value of the operating parameter, the frequency being generated within the first frequency range and the second frequency range in response to a control value of the control signal, the control value being within a predetermined control value range;

a first circuit arranged to adjust the parameter values of the operating parameter;

a second circuit arranged to control a ratio of the frequency to the control value within the first frequency range;

a third circuit arranged to control the ratio within the second frequency range; and a switch arranged to select between the second circuit and the third circuit.

5. The apparatus of claim 4 wherein tile second circuit and the third circuit each comprises:

a transistor defining an output path; and a resistor connected in the output path.

6. The apparatus of claim 5 wherein each of the transistors comprises a field effect transistor including a source and drain defining a source-drain path.

7. The apparatus of claim 6 wherein each of the output paths comprises the source-drain path.

* * * * *